United States Patent [19]

Thompson et al.

[11] Patent Number: 5,176,773
[45] Date of Patent: Jan. 5, 1993

[54] METHOD OF MANUFACTURING A CERAMIC CARRIER

[75] Inventors: Kenneth R. Thompson, Sunrise; Anthony B. Suppelsa, Coral Springs, both of Fla.

[73] Assignee: Motorola, Inc., Schaumburg, Ill.

[21] Appl. No.: 549,841

[22] Filed: Jul. 9, 1990

[51] Int. Cl.⁵ .................... C04B 37/00; B32B 31/26
[52] U.S. Cl. ..................................... 156/89; 264/61; 264/66
[58] Field of Search ............... 264/60, 61, 66, 104; 156/89

[56] References Cited

U.S. PATENT DOCUMENTS

| | | | |
|---|---|---|---|
| 4,641,425 | 2/1987 | Dubuisson et al. | 264/61 |
| 5,006,182 | 4/1991 | Gantzhorn, Jr. et al. | 156/89 |
| 5,028,473 | 7/1991 | Vitriol et al. | 156/89 |

Primary Examiner—James Lowe
Assistant Examiner—Christopher A. Fiorilla
Attorney, Agent, or Firm—Dale W. Dorinski

[57] ABSTRACT

A method of manufacturing a ceramic substrate with improved mounting pad location tolerances. The method begins with a green non-dimensionally stable ceramic base 10 to which at least one conductive layer 15, 16 such as a tungsten mixture is screen printed. The tungsten layer locationally defines a pattern including pads 15. This composite assembly is subsequently stabilized as in firing and a second insulating ceramic slurry layer with openings 29 located over the relative larger pads is screen printed on the stabilized composite assembly. This method eliminates tolerances in final mounting pad location due to unpredictable shrinkage and yet maintains excellent mounting pad adhesion since the entire pad overlays some portion of the tungsten pad.

3 Claims, 2 Drawing Sheets

METHOD OF MANUFACTURING A CERAMIC CARRIER

BACKGROUND OF THE INVENTION

The present invention relates generally to the manufacture of ceramic carriers and specifically to those ceramic carriers requiring that certain surface features be accurately located in predetermined locations.

The problem generally addressed by this invention is caused by the fact that much of the process of manufacturing a ceramic carrier is often done while the ceramic base is in a "green" non-dimensionally stable state. The procedure of dimensionally stabilizing the "green" ceramic carriers, called firing causes the ceramic base material to shrink in a somewhat predictable fashion.

Prior processes attempted to compensate for the predictable portion of the final dimensional uncertainty in surface feature location by processing the ceramic carrier and its features in a green state on an oversized scale. This process usually includes applying a conductive tungsten pattern which defines the contact pad locations to a green ceramic base, and then firing this assembly. Since the final contact pad location depends on their screened location and predicted amount of shrink, any uncertainty in this prediction will be in the finished carrier.

One known prior approach consists of applying a conductive tungsten pattern including tungsten contact pads then applying a ceramic slurry with openings which are smaller than the underlying contact pad areas and then stabilizing or firing all layers. After stabilizing the openings are filled with nickel plating and subsequently gold or other plating. This process does not eliminate dimensional uncertainty due to imperfect shrinkage estimates but is desired to prevent contaminates entering the tungsten-ceramic base interface region.

SUMMARY OF THE INVENTION

A method of manufacturing a ceramic carrier that overcomes the dimensional location uncertainty and pad adhesion problems of the prior art by properly ordering a series of process steps beginning with some form of a ceramic base. This ceramic base is usually in a green or non-dimensionally stable state.

The ceramic base has a pattern applied to its surface that defines some features and characteristics desired in the final ceramic carrier. This step may be a screen print operation in which a tungsten layer is applied that defines for example, the location and dimensions of one or more pads, as well as desired interconnections between the pads.

The next essential step includes some processing of the ceramic base and this first pattern after which this composite assembly may be viewed as dimensionally stable or stabilized. This process step on a green ceramic base is usually called or includes firing or curing via some time-temperature profile.

The final essential step or procedure in this method is the application of a second pattern which defines one or more openings to a portion of the underlying features or characteristics defined by the first pattern. These openings will have locational dimensions determined by the requirements placed on the final ceramic carrier and size dimensions relatively smaller than the substantial degree be determined by the uncertainty in absolute location of the boundaries of the underlying features caused by imperfect predictability of the dimensional changes of the composite assembly during the stabilizing process. This assures the area of the opening is at worst case coincident with some portion of the underlying feature area. This step may typically be screen printing a ceramic slurry insulating layer with appropriately dimensioned openings over the underlying pads of the stabilized composite assembly, and subsequently curing the glass slurry via heating or firing at a time temperature lower than that of the previous processing.

DESCRIPTION OF THE PREFERRED EMBODIMENT

Figure 1:
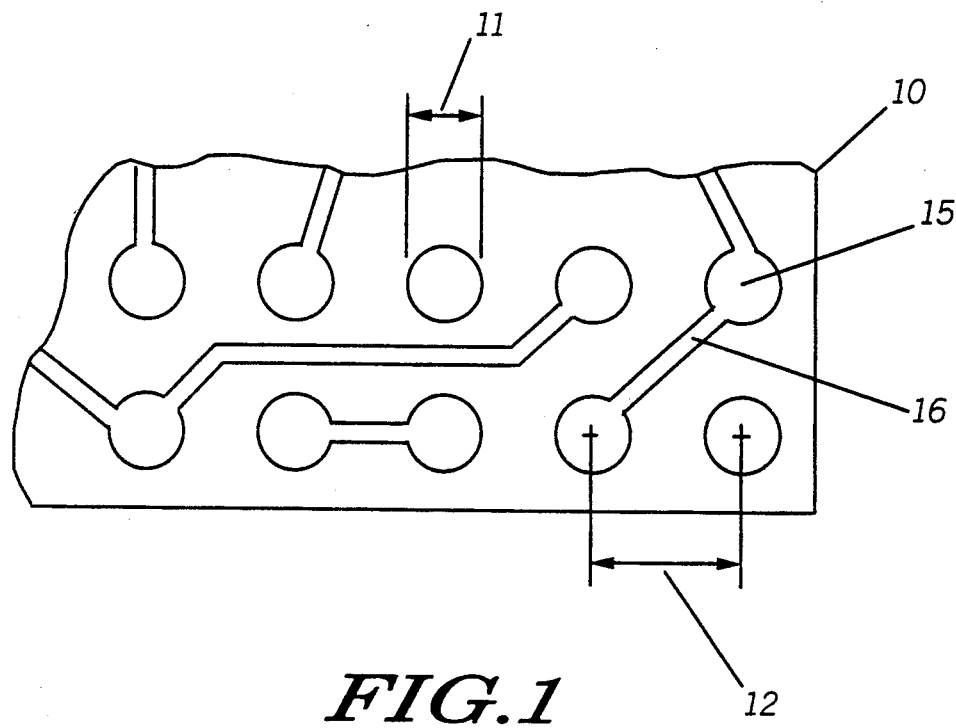
FIG. 1 is a top plan view of a portion of a green ceramic base with a patterned tungsten layer defining the contact areas or pads and interconnects in accordance with the present invention.

The method of manufacturing a ceramic carrier in accordance with the preferred embodiment of this invention begins with a ceramic base 10 in FIG. 1; formed, for example, from a "green" non-dimensionally stable ceramic material. A first pattern consisting of pads 15 and interconnects 16 has been applied to the ceramic base and constrains the surface location of various features of the finished ceramic carrier. This first pattern 15, 16 is a signal carrying compound, such as a conventional tungsten mixture consisting of glass, ceramic, and tungsten, which will adhere to the ceramic base 10 when properly processed, for example, firing in the case of the tungsten mixture. All dimensions illustrated in FIG. 1, such as pad diameter(s) 11 and pad center to center spacings 12 have been chosen to compensate for predictive changes resulting from further processing of the ceramic base 10 and first pattern 15, 16 as for example shrinkage when firing a green ceramic base. The processing contemplated above includes any procedure required to substantially dimensionally, structurally, stabilize the ceramic base 10 and first pattern 15, 16.

Figure 2:
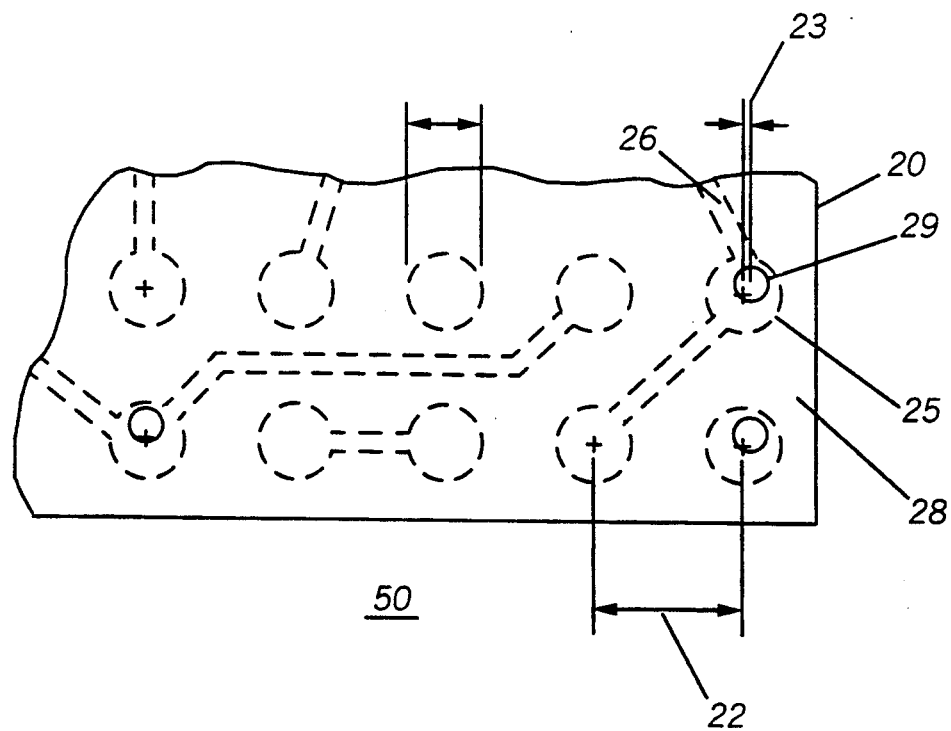
FIG. 2 is a top plan view of the fired or stabilized ceramic base and tungsten pattern of FIG. 1 covered by a screen printed ceramic slurry layer illustrating openings.

After processing, firing, the ceramic base 20 and first pattern 25, 26 has a second pattern 28, for example, an insulating ceramic slurry layer consisting of glass, organic binder, and ceramic powder with openings 29 applied over, on top, of it. FIG. 2 illustrates a deviation 23 between the predicted shrinkage and actual shrinkage by the fact that the center location of opening 29 does not coincide with the center location of pad 25. The inherent tolerance of this method for manufacturing a ceramic carrier 50 is also demonstrated by noting that all the area encompassed by opening 29 is coincident or overlays a portion of pad 25. Finally, if required as in the case of a ceramic slurry second pattern this layer may be stabilized by a low temperature firing at 400° to 850° C.

Figure 3:
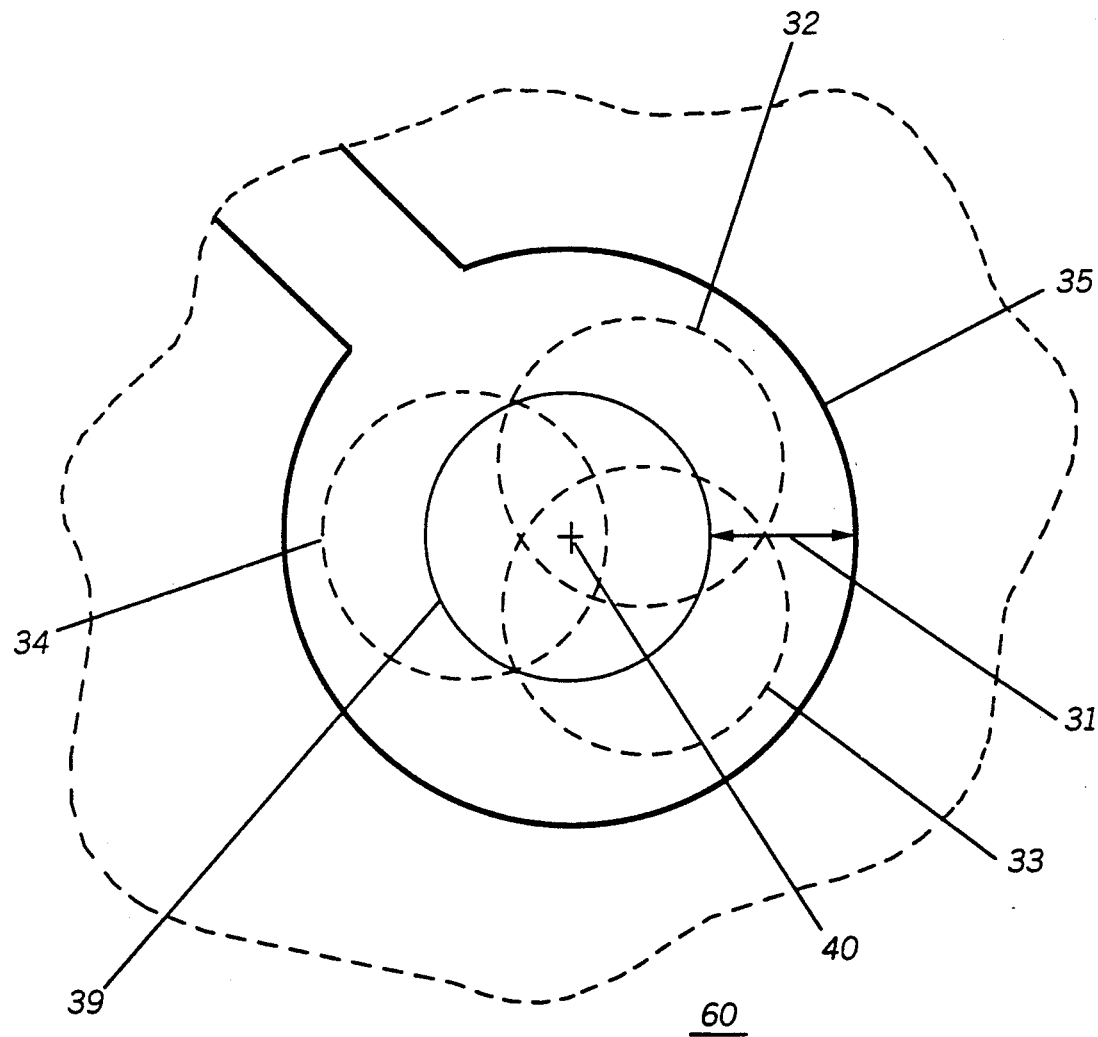
FIG. 3 is an enlarged fragmentary view of the finished ceramic carrier demonstrating one mounting pad and opening and the inherent tolerance advantage of this method.

A detailed section 60 of FIG. 3 will aid in the understanding of the inherent advantages of this inventive method. This drawing represents the unlikely event that all process steps yield nominal results, in particular that predicted shrinkage and actual shrinkage were equal, the actual center point 40 of pad 35 and opening 39 are coincident. Some stabilized, finished dimensions as presently practiced by the invention include a pad 35 diameter of 0.040 inches, an opening 39 diameter of 0.030 inches, and center to center spacing 22 of 0.060 inches. The tolerance 31 of this process to all deviations from nominal with these dimensions is 0.005 inches in any direction, for example, 32, 33, 34 in FIG. 3 and yet maintain 100% coincidence with the pad 35 area and opening 39 area. For current typical ceramic carrier size and shrinkage unpredictability, this tolerance is sufficient to provide a surface feature, solderable mounting pad, encompassing the area of opening 39 that allows accurate absolute location of the mounting pad and retains excellent adhesion of the mounting pad to the underlying pad 35.

This solderable mounting pad above can be formed by a nickel plate operation prior to or after the second pattern application and stabilization followed by a gold plating process if desired. The invention is particularly useful where the ceramic carrier is to be utilized as a chip carrier having a closely spaced mounting pad array. The required spacing and location of the mounting pad array is maintained without using oversized mounting pads or otherwise sacrificing spacing between mounting since it is defined in post ceramic firing operations and therefore does not have to compensate for the unpredictable portion of shrinkage. While the invention has been described in terms of the present embodiment, it is intended to encompass various modifications and equivalent arrangements included within the spirit and scope of the claims.

What we claim is:

1. A method of manufacturing a ceramic carrier comprising the steps of:
   (a) providing a base consisting of a non-dimensionally stable ceramic substrate;
   (b) applying a conductive pattern to the non-dimensionally stable base, the conductive pattern defining at least one pad;
   (c) firing for a first time the non-dimensionally stable base and the conductive pattern;
   (d) then applying an insulating pattern to the fired base and the conductive pattern, the insulating pattern defining at least one opening substantially coincident with a portion of the pad defined by the conductive pattern, and the at least one opening being smaller than the at least one pad; and
   (e) then firing the insulating pattern.

2. A method of manufacturing a ceramic carrier comprising the steps of:
   (a) providing a base consisting of a non-dimensionally stable ceramic substrate;
   (b) applying a conductive pattern to the non-dimensionally stable base, the conductive pattern defining a plurality of pads having a first diameter;
   (c) firing for a first time the non-dimensionally stable base and the conductive pattern;
   (d) applying a ceramic slurry defining an insulating pattern to the fired base and the conductive pattern, the insulating pattern having a plurality of openings of a second diameter less than the first diameter in the insulating pattern, the openings being coincident with a portion of the pads; and
   (e) then firing the insulating layer.

3. A method of manufacturing a ceramic carrier as defined in claim 2, comprising the further step of metal plating the portions of the pads that are exposed through the openings.

* * * * *